(12) United States Patent
Joseph

(10) Patent No.: US 6,456,076 B1
(45) Date of Patent: Sep. 24, 2002

(54) Z GRADIENT SHIELDING COIL FOR CANCELING EDDY CURRENTS

(75) Inventor: Peter M. Joseph, Upper Darby, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 09/774,946

(22) Filed: Jan. 31, 2001

(51) Int. Cl.$^7$ .................................................. G01V 3/00
(52) U.S. Cl. ........................ 324/318; 324/322; 324/309
(58) Field of Search ............................... 324/318, 322, 324/300, 307, 309; 128/653.3; 335/219

(56) References Cited

U.S. PATENT DOCUMENTS

| 4,617,516 A | 10/1986 | Schenck | 324/318 |
| 4,733,189 A | 3/1988 | Punchard et al. | 324/318 |
| 4,737,716 A | 4/1988 | Roemer et al. | 324/319 |
| 4,794,338 A | 12/1988 | Roemer et al. | 324/39 |
| 5,289,129 A | 2/1994 | Joseph | 324/318 |

Primary Examiner—Edward Lefkowitz
Assistant Examiner—Brij B. Shrivastav
(74) Attorney, Agent, or Firm—Woodcock Washburn LLP

(57) ABSTRACT

A cylindrical whole body magnetic resonance imaging system gradient shielding coil having multiple windings which are individually wound about a cylindrical support structure such that the windings are evenly distributed in azimuthal angle and interleaved with one another. The windings are preferably spaced in azimuthal angle by 360°/N, where N is the number of windings. In such a design, m azimuthal harmonic components of the error field caused by the effects of eddy currents within the imaging volume can be canceled. Canceling an increasing number of m components requires increasing the N number of windings.

32 Claims, 15 Drawing Sheets

Z GRADIENT SHIELDING COIL FOR CANCELING EDDY CURRENTS

Statement Regarding Federally Sponsored Research or Development

This invention was supported in part by funds from the National Institutes of Health (NIH Grant No. R01 NS32789). Accordingly, the United States government may have certain rights in the invention.

BACKGROUND OF THE INVENTION

1. Field of the Invention

The present invention generally relates to magnetic resonance imaging coils and, more particularly, to z-gradient shielding coils.

2. Background of the Invention

Magnetic resonance imaging (MRI) systems are currently employed in forming images of the internal human anatomy. In such systems, a patient is placed in a magnetic field and is subjected to radio-frequency electromagnetic pulses. The magnetic resonance of the atomic nuclei of the patient are detected with a radio frequency receiver to provide information from which an image of that portion of the patient containing these nuclei may be formed. The magnetic field includes a main magnetic field and three additional fields with linear spatial gradients in the x, y, and z directions The main magnetic field is a very strong magnetic field, which may be created by a super-conducting coil, a resistive coil, or a permanent magnet. Normally, the z-axis is parallel to the axis of the main magnetic field for systems in which the magnet has cylindrical geometry, such as for whole body imaging. The linear gradient magnetic fields are typically created by resistive coils and are referred to as gradient coils. The resistive coils create a magnetic field within the coil with a linear spatial gradient, also referred to as a magnetic gradient. Typically, there is one gradient coil for each of the x, y and z-axes, which create x, y, and z magnetic gradients, respectively. Two different types of gradient coils are typically used to produce the magnetic gradients for MRI, one which creates a magnetic gradient along the z (or longitudinal) axis of the coil, and two others which create magnetic gradients along either the x or y (transverse) axes.

In operation, for imaging purposes, it is necessary to rapidly pulse electrical current through the three gradient coils. When this is done, a problem commonly encountered is the induction of eddy currents in various metallic parts of the MRI system. The MRI system typically contains a metallic cylinder called a bore tube. The inside of the bore tube is an image volume; however, most imaging occurs only in the central portion of the bore tube. The current in the gradient coils induce eddy currents in the bore tube of the MRI system that, in turn, induce a magnetic field within the image volume, referred to as the error field. The magnetic field created by the eddy currents is undesirable in the image volume. In many medically useful imaging procedures, it is highly desirable to reduce or eliminate these eddy currents.

Typically, eddy currents are reduced by surrounding each gradient coil, also referred to as the inner coil, with another similar coil, an outer coil or a shielding coil, to cancel the magnetic and induced electric fields in the region outside of the outer coil. A set of a gradient coil and its associated shielding coil is referred to as a shielded gradient coil set. Ideally, the shielding coil is designed to exactly cancel the electric and magnetic field outside of the coil set. If no field exists outside of the shielded gradient coil set, then no eddy currents can be induced in the metallic parts of the MRI system, and therefore, no error field will be produced in the image volume.

Not all eddy currents affect the imaging volume equally, in particular, the induced eddy currents and magnetic fields can be analyzed in terms of the azimuthal harmonic number, m. The azimuthal harmonic number m means that the field or gradient varies in azimuthal angle like cosine($m\phi$), sin ($m\phi$), or a linear combination of the two, where $\phi$ is the azimuthal angle as shown in FIG. 5B. That is, the field goes through exactly m full cycles as the angle varies from 0 to 360 degrees. The worst effects are seen from eddy currents with m=0. These harmonics also have the longest lifetime, which can be as long as several seconds. In general, the lower the m number, the worse the effects on an MRI system.

Existing attempts to reduce the eddy current effects have only been partially successful, especially for the z-gradient coil set. One common technique for making z-gradient coils is using circular parallel loops of wire, all of which lie in planes that are perpendicular to the z-axis. The loops are interconnected by straight wires that lie on the outer cylindrical surface of a support structure and are parallel with the z-axis. This design has the advantage that it creates no x or y magnetic gradient. This is important because it is undesirable to use a z-gradient coil that creates x or y magnetic gradients. However, the z-gradient that is created is not exactly homogenous, but varies with the radius from the z-axis.

The problem with this conventional shielding is that it is impossible to exactly cancel the field outside of the z-gradient coil set. A continuous surface current distribution would be required on the surface of the shielding coil to exactly cancel the field outside of the gradient coil set. Conventional shielding simulates a continuous surface current distribution by winding several discrete circular loops around a support structure. However, these discrete circular loops cannot exactly simulate a continuous surface distribution, and therefore, never exactly cancel the field outside of the gradient coil set.

While is not possible to exactly cancel the entire field outside of the gradient coil set, it would be desirable to cancel the specific harmonics that are most troublesome to the MRI system. Therefore, a shielding coil for a z-gradient coil that exactly cancels the magnetic fields of low azimuthal harmonic number, m, outside of the z-gradient coil set would be very desirable.

FIG. 1 illustrates an exemplary prior art MRJ system 10 as disclosed in U.S. Pat. No. 4,733,189. As shown in FIG. 1, the MRI system 10 includes a main magnetic component 20, gradient coils 30, shielding coils 40, and a detection component 50.

The main magnetic component 20 can be a permanent magnet, a resistive electromagnet, or a superconducting system as shown, in which a solenoidal electromagnet 22 is encased within a cryogenic vessel 26. Bore tube 28 supports the solenoidal electromagnet 22. Image volume 24 is located centrally to the main magnetic component 20.

Gradient coils 30 include an x-gradient coil 32, a y-gradient coil 34 and a z-gradient coil 36, disposed to create gradient fields orthogonal to each other. X and y gradient-producing coils are preferably implemented by saddle-shaped coil elements disposed about the main magnetic field axis and rotated ninety degrees from each other in orientation. As shown, the z-gradient coil 36 is implemented by a parallel loop gradient coil coaxial with the main magnetic field axis.

Detection component 50 includes a radio frequency (RF) coil 52 and an RF interrogator 56 and receiver 58. The interrogator 56 produces a pulse of radio frequency excitation and the energy emitted as the atoms return to an aligned state is captured via coil 52 and used to obtain an image signal. In use, a patient or other object is positioned within the image volume 24 of the system 10.

Shield component 40 includes an x-shielding coil 42, a y-shielding coil 44, and a z-shielding coil 46 disposed to counteract the eddy currents induced by the gradient-producing coils 32, 34 and 36, respectively. The x and y shielding coils, 42 and 44 may be implemented by saddle-shaped coils cut from flat copper sheets and rolled into the appropriate saddle shapes. As shown, the z-shielding coil 46 is implemented by a parallel loop shielding coil coaxial with the main magnetic field axis.

FIG. 2 illustrates an exemplary prior art parallel loop gradient coil of a type which may be used as a z-gradient coil 36 in FIG. 1. As shown in FIG. 2, parallel loop gradient coil 80 includes loops 81 interconnected by straight wires 82 that lie on the outer cylindrical surface of a support structure 84 and parallel with the z-axis. The loops 81 and straight wires 82 are formed from a single wire 86. Terminal connections 88 are connected to both ends of the single wire 86. This design has the advantage that it creates no x or y magnetic gradient. This is important because it is undesirable to use a z-gradient coil that creates x or y magnetic gradients. However, the z-gradient that is created is not exactly homogenous but varies with the radius from the z-axis. The number of loops is determined by the current available and the gradient desired. Typically, two pairs of loops are used, called a Maxwell pair.

FIG. 3 illustrates an exemplary prior art multiple winding gradient coil as described in U.S. Pat. No. 5,289,129 to Joseph, which may be used as a z-gradient coil 36 in the exemplary MRI system of FIG. 1. As shown in FIG. 3, multiple winding gradient coil 100 includes two windings. The first electrically conductive winding 112 is wound about the surface of cylindrical coil support structure 110. The first electrically conductive winding 112 is wound helically in a synmmetric manner about the center 114 of the coil support structure 110. Terminal connections 116 are connected to the first winding 112. A second electrically conductive winding 118 is also wound in an interleaved manner with respect to the first winding 112. In accordance with the invention, the second winding 118 is offset in azimuthal angle by 180° (360°/2 windings) with respect to the first winding 112. For ease of illustration, the wire diameter of the second winding 118 has been illustrated to have a smaller diameter than the wire diameter of first winding 112. As with the first winding 112, second winding 118 also has a terminal connection 120 to which current is applied from a power supply (not shown) for generating a magnetic field. In another embodiment, the winding gradient coil may include a plurality of windings, offset in azimuthal angle by 360°/X windings. Any number of windings can be used, but for simplicity, only two are shown. The contents of U.S. Pat. No. 5,289,129, are hereby incorporated by reference for ease of description.

FIG. 4 illustrates an exemplary prior art parallel loop shielding coil, for use as a shielding coil 46 as shown in FIG. 1. As shown in FIG. 4, loops 130 are interconnected by straight wires 132 that lie on the outer cylindrical surface of a support structure 134 and are parallel with the z-axis. The loops 130 and straight wires 132 are formed from a single wire 136. Terminal connections 138 are connected to both ends of the single wire 136. Experience indicates that existing art is only partially successful in reducing eddy current effects, especially for the z gradient coil set.

A z-gradient shielding coil and a z-gradient coil set is desired that improves upon the coils and coil sets of the prior art to reduce eddy currents induced in the MRI system, particularly eddy currents with low azimuthal harmonic number, m. The present invention has been developed to address these needs in the art.

SUMMARY OF THE INVENTION

The above mentioned needs are met by a cylindrical whole body magnetic resonance imaging system gradient shielding coil having multiple windings which are individually wound about a cylindrical support structure such that the windings are evenly distributed in azimuthal angle and interleaved with one another. The windings are preferably spaced in azimuthal angle by 360°/N, where N is the number of windings. In such a design, m azimuthal harmonic components of the error field caused by the effects of eddy currents within the imaging volume can be canceled. Canceling an increasing number of m components requires increasing the N number of windings.

The cylindrical shielding coil of the present invention provides a canceling magnetic field gradient to cancel an error magnetic field gradient created within the imaging volume by eddy currents generated by a gradient coil in a volume outside of the gradient coil. The shielding coil includes a non-magnetic electrically insulating cylindrical coil support having an internal cavity which forms a volume for accepting the gradient coil and the imaging volume. N electrically conductive cylindrical windings are wound in a plurality of turns in a substantially helical path about a surface of the coil support, each turn of each winding being electrically spaced from each other turn of each the winding such that spacing between respective turns of each the winding decreases in approximate proportion to the distance of the respective turns from a center of each of the windings in a direction parallel to the axis of the coil. Each of the N windings is interleavingly wound in the same direction about the surface of the coil support and separated from each other winding of the N windings in an angular orientation of approximately 360°/N about the coil support. N is determined so as to cancel all harmonics up to and including the $M^{th}$ harmonic of the error magnetic field gradient.

The present invention also includes a gradient coil set for use in a magnetic resonance imaging system. The gradient coil set includes a cylindrical gradient coil and a cylindrical shielding coil. The shielding coil is as described above. The gradient coil may be any cylindrical gradient coil.

The present invention also includes a gradient coil set electrically connected together to provide a fraction of the current to the shielding coil. The gradient coil may include a plurality of gradient windings with an inductance and a resistance. The shielding coil may include a plurality of shield windings with an inductance and a resistance. The gradient coil set may include at least one external coil having an inductance and resistance substantially equivalent to the inductance and resistance of the gradient winding of the shielding coil. The plurality of shield windings are connected in parallel. One of the plurality of gradient windings are connected in series to the plurality of shield windings. The remaining gradient windings are connected in series with an external coil. The combination of the plurality of gradient windings connected in series to the plurality of shield windings is connect in parallel to the combination of the remaining gradient windings connected in series with the external coil.

BRIEF DESCRIPTION OF THE DRAWINGS

The above and other aspects and advantages of the present invention will become more apparent and more readily appreciated from the following detailed description of the presently preferred exemplary embodiments of the invention taken in conjunction with the accompanying drawings, of which.

DETAILED DESCRIPTION OF THE PREFERRED EMBODIMENTS

The main advantage of the multiple winding shielding coil technique of the present invention over the parallel loop shielding coil technique of the prior art is that the eddy current distributions with low azimuthal harmonic number, m, can theoretically be canceled exactly. Due to practical constraints, including the placement of coil wires and the movement of coil wires over time, exact cancellation of the eddy currents by the multiple winding shielding coil of the present invention is not probable. However, the present invention may perform better than conventional shielding coils with regard to low number m harmonics.

In accordance with the present invention, cancellation of the m=0 component may be achieved with a single wire, but at the expense of creating eddy currents and resultant magnetic fields with higher m numbers. However, these higher m fields make no contribution to the magnetic field in the z direction in the center of the image volume and also decay much faster than the m=0 components. Therefore, these higher m number eddy currents and resultant magnetic fields are less troublesome in MRI applications. Furthermore, by increasing the number of windings, higher m errors can be reduced to arbitrarily low levels. With a parallel loop gradient coil and N spiral windings distributed equally in angle on a shield coil, all harmonic components, m, are cancelled except those that are integer multiples of N. It is not necessary that N be a power of 2 or an even number. For example, with N=3, all components will be cancelled except for $|m|$=3,6,9,12, etc.

Figure 5B:
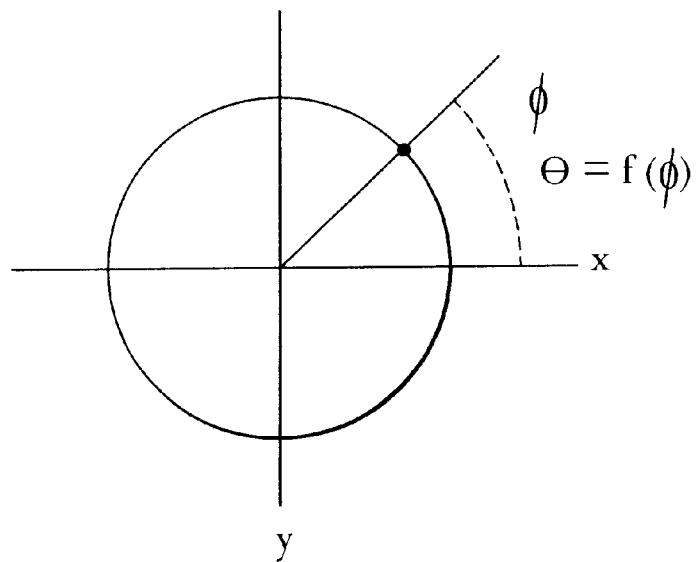
FIGS. 5A and 5B illustrate a coordinate system for analyzing coil magnetic fields.
Figure 5A:
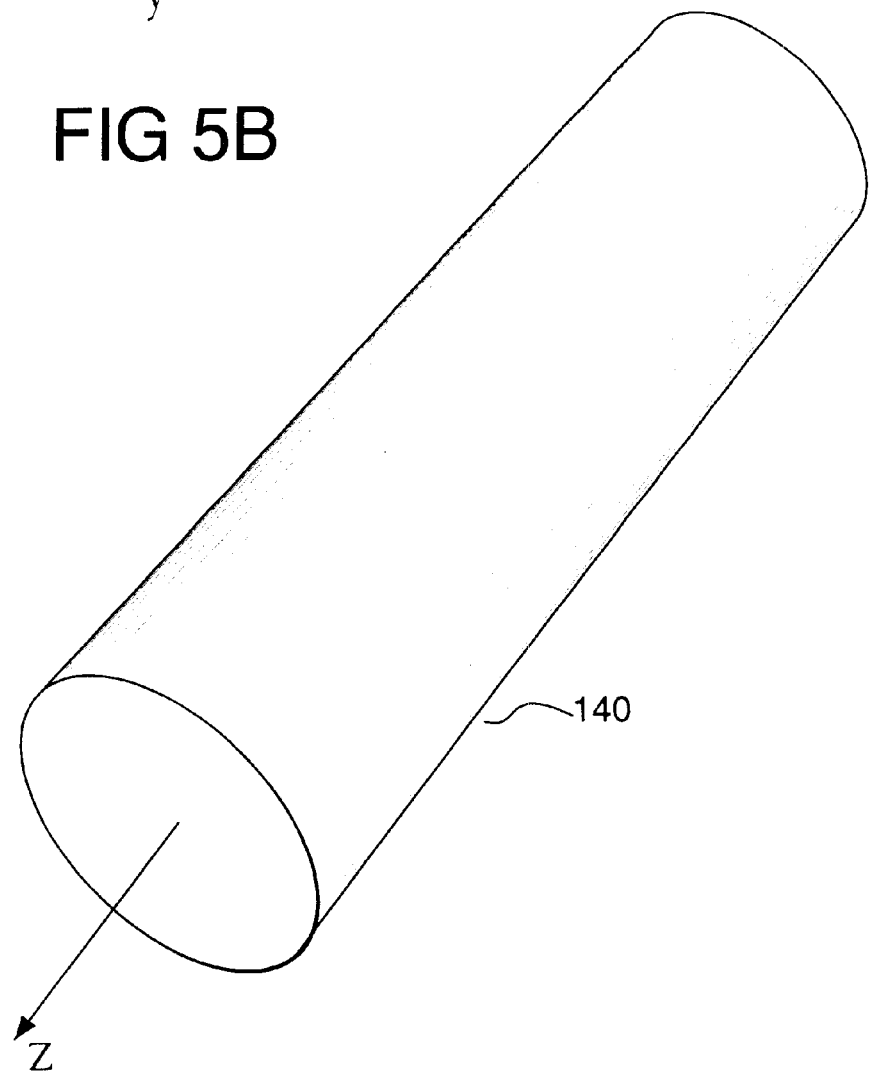

The cause of the eddy current problem addressed by the present invention can be understood if the induced currents and magnetic fields are analyzed in terms of the azimuthal harmonic number, m. FIGS. 5A and 5B illustrate a coordinate system for analyzing harmonics of induced currents and magnetic fields from a coil. FIG. 5A is a perspective view of a coil. The coil 140 may be a gradient coil, a shielding coil, or a main magnet coil as all these coils are typically coaxial in an MRI full body imaging system. As shown in FIG. 5A, the z-axis is co-axial with the main axis of the coil 140. FIG. 5B is a cross sectional view of the coil of FIG. 5A. As shown in FIG. 5B, angles $\phi$ and $\theta$ represent the angle between the x-axis and a point on the coil. The angle $\phi$ runs from 0° to 360° and then begins again at 0° after one complete rotation around the coil. The angle $\theta$ increments by 360° upon every complete rotation around the coil.

Figure 1:
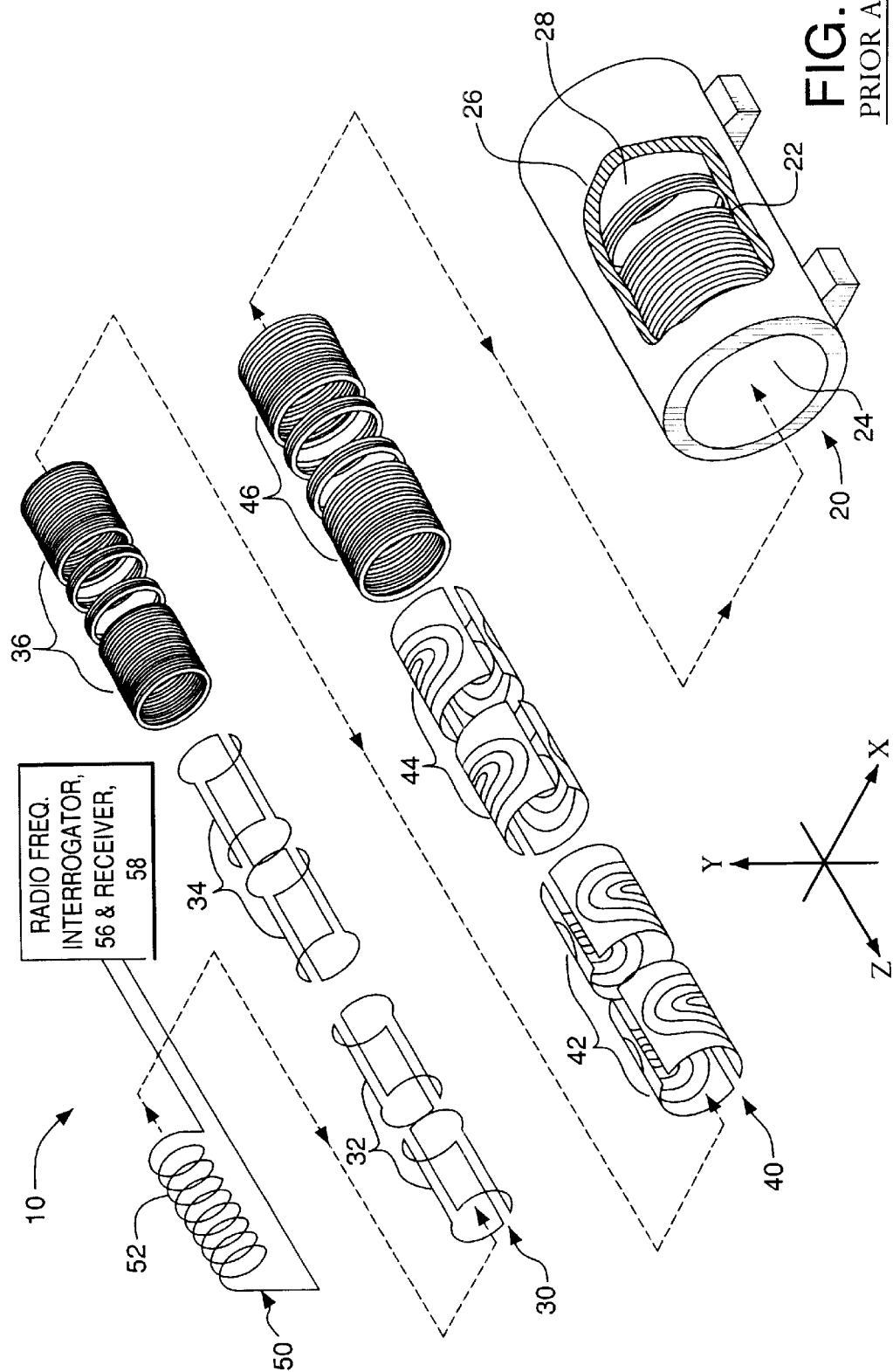
FIG. 1 illustrates an exemplary prior art magnetic resonance imaging system.
Figure 6:
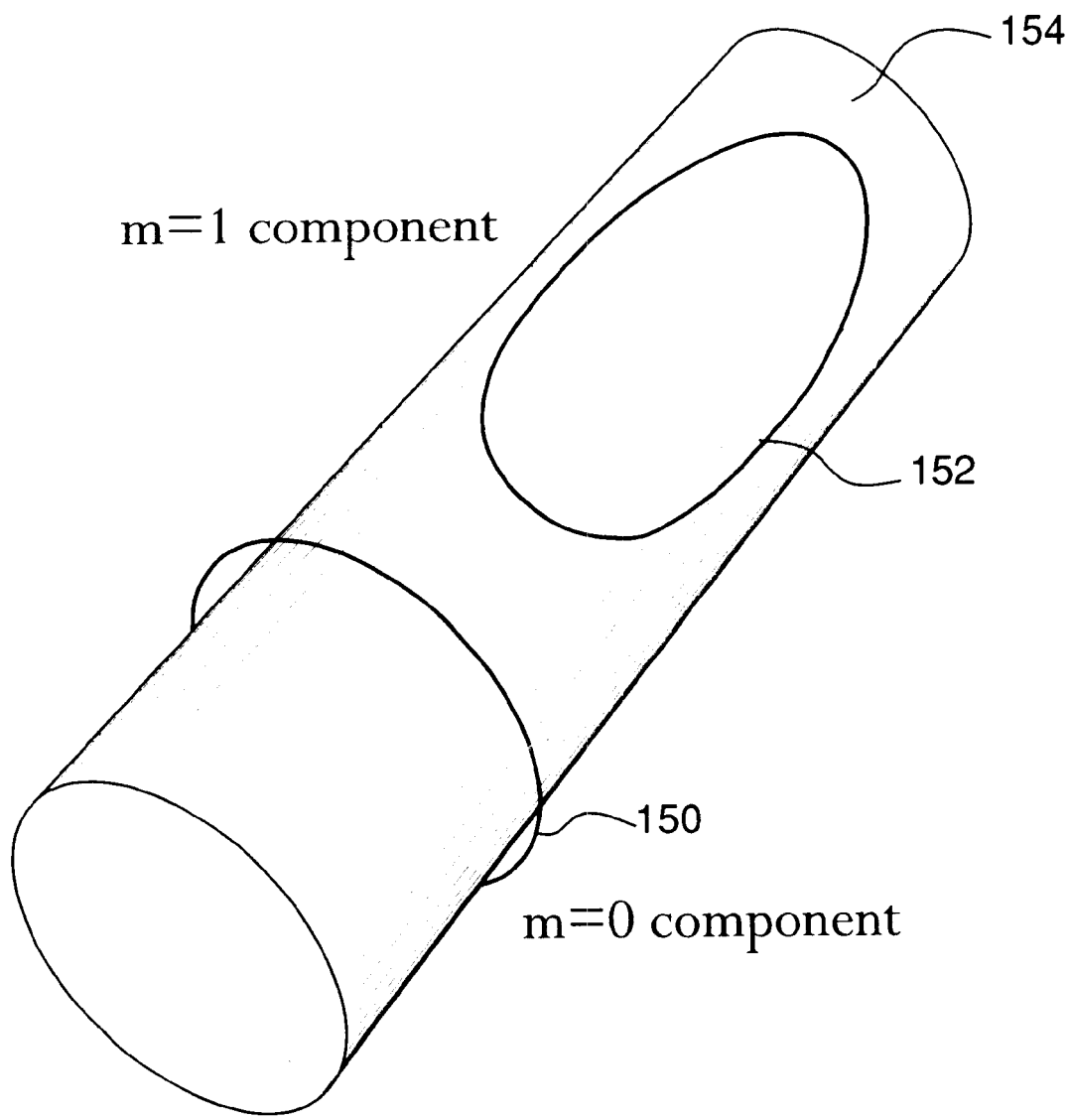
FIG. 6 illustrates exemplary eddy currents in a cylinder.

FIG. 6, shows the eddy currents produced for different azimuthal harmonic numbers, m. As shown in FIG. 6, only the m=0 component 150 of the current circulates fully around the cylinder 154. The cylinder 154 may be the cryogenic vessel as shown in FIG. 1, specifically the inside diameter of the cryogenic vessel also referred to as the bore tube 28, or any electrically conducting object outside of the gradient coil. All higher values of $|m|$ have current distributions which pass part way around the cylinder 154 and then, while flowing also along the z direction, turn around and make a complete loop without encircling the z-axis. For example, as shown in FIG. 6, the m=1 component 152 flows partially along the x-axis, then partially along the y-axis, but never encircles the z-axis. The m=0 component is the only component in which there is no motion of the current along the z-axis, as it is a purely transverse current distribution.

Figure 4:
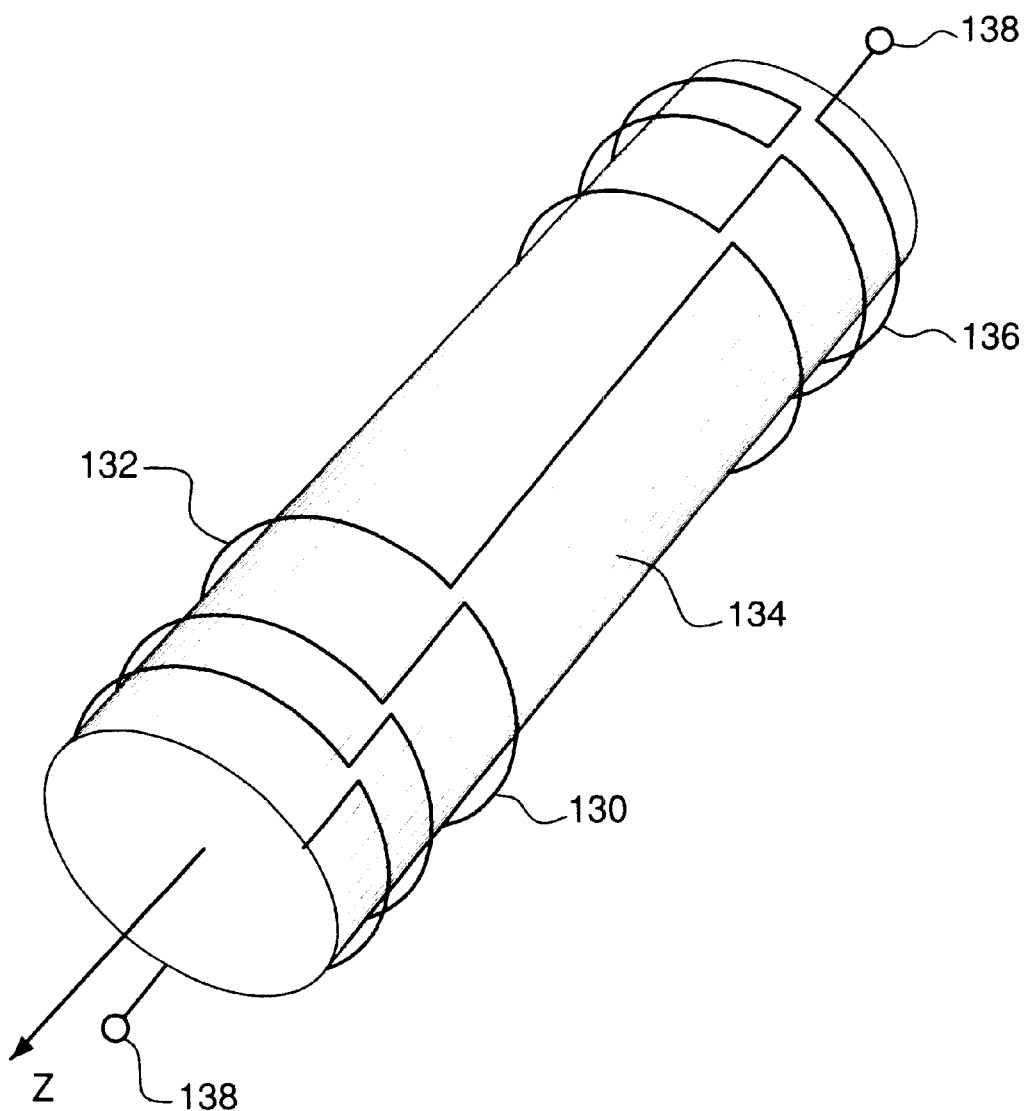
FIG. 4 illustrates an exemplary prior art parallel loop shielding coil.

To fully cancel all harmonics of all eddy currents requires that the shielding coil have a two dimensional continuous distribution of surface current density $\lambda(\phi,z)$ which is determined by the design of the underlying main gradient coil. There are established ways to calculate the desired surface current density $\lambda(\phi,z)$; for example, see Carlson and Zha, Magn. Resn. Med. 1996; 36:950–54. However, there are no practical methods of implementing a system of this type. Existing techniques use a series of circular loop coils arranged perpendicular to the z-axis as shown in FIG. 4 to approximate a continuous current density. The parallel loop shielding coil cancels the error field along the $\theta$ axis well, but only approximates the cancellation of the error field along the z-axis.

Figure 7:
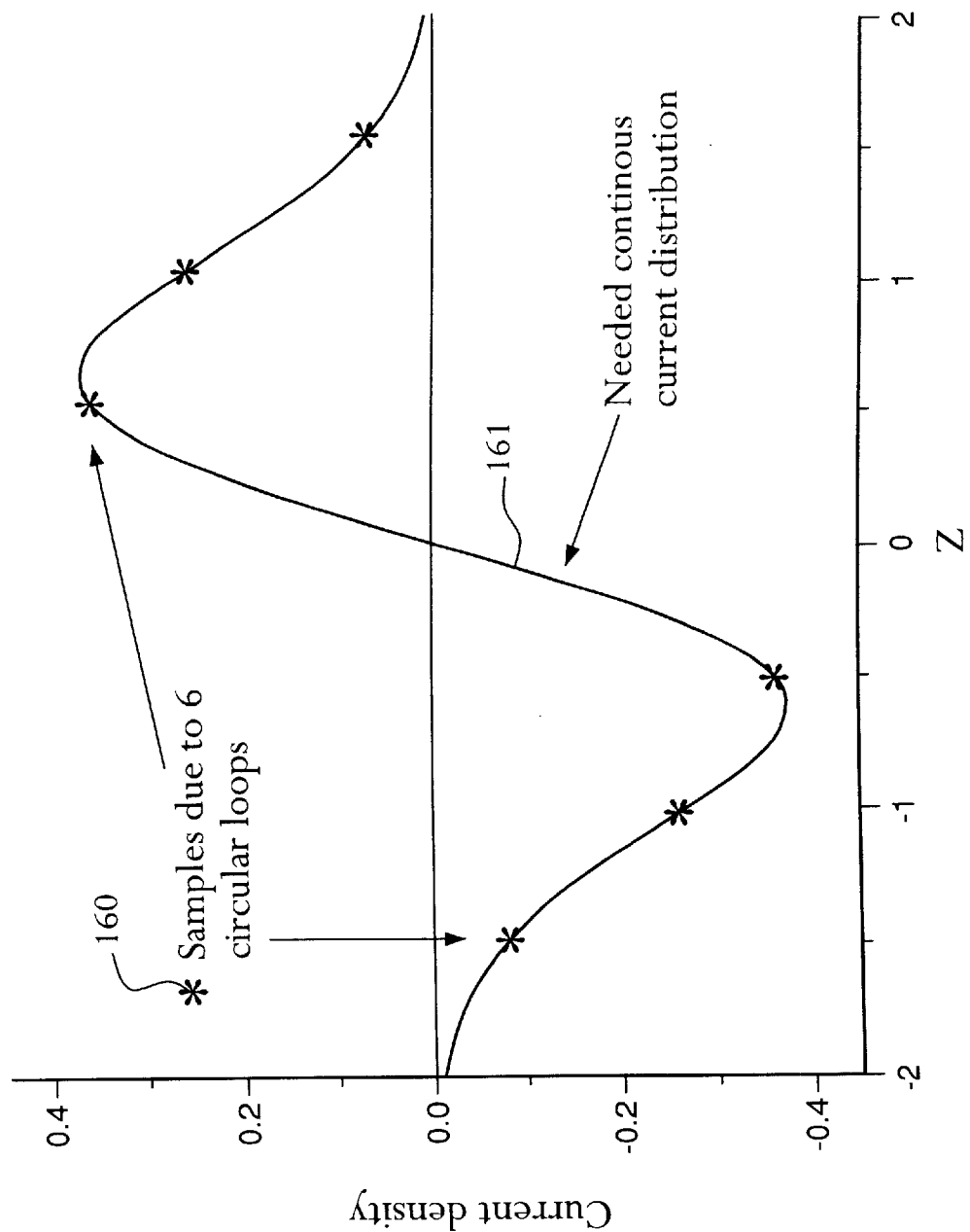
FIG. 7 illustrates an exemplary continuous surface current distribution required for exact cancellation of magnetic fields outside of a shielding coil.

The reason that the parallel loop shielding coil fails to completely shield the gradient coil is illustrated in FIG. 7, which shows an illustration of the form of the needed surface current distribution, $\lambda_o(z)$, 161 as a smooth function of z. Any design for the z-gradient shielding coil that uses parallel loops is equivalent to sampling that distribution at a finite number of z values, shown as 160 in FIG. 7. Such finite number of samples can never exactly reproduce the continuous function of z that is required for exact cancellation of fields external to the shielding coil.

The present invention provides a shielding coil for exact cancellation of error fields along the z-axis, at least for one azimuthal harmonic number (m=0), and for cancellation of up to a maximum azimuthal harmonic number, M. The invention, however, does introduce errors of higher number m components, and does not exactly cancel the error fields along the θ axis. Even though these errors are not completely cancelled, they are less troublesome for MRI systems.

Analysis of the azimuthal harmonic number is equivalent to expanding the angular dependence in a Fourier series; for example, the transverse surface current density, λ, in amps/meter can be expressed as:

$$\lambda(\phi,z) = \Sigma_m \lambda_m(z) \exp(im\phi) \qquad \text{Equation 1}$$

where φ is the azimuthal angle of a point on the surface of the cylinder of the shielding coil and m is an integer running from −∞ to ∞.

The Fourier coefficients $\lambda_m$ (z) are functions of z and can be computed from a known current density using:

$$\lambda_m(z) = (\tfrac{1}{2}\pi) \int d\phi \lambda(\phi,z) \exp(-im\phi) \qquad \text{Equation 2}$$

and the integral is over a range of 2π for the angle φ.

At issue is which m components are most troublesome for the MRI system. This can by understood by looking at the radial dependence of the magnetic fields generated by a current density of a specific m value. The full analysis of this problem involves another Fourier transformation over the z coordinate and is beyond the scope of this invention. The important conclusion is that near the center of the cylinder, which is where the person or object to the imaged is placed, the magnetic field strength will be approximately proportional to the radius raised to the m-th power.

$$\text{Field} \propto r^m \qquad \text{Equation 3}$$

Thus, the worst effects are seen from eddy currents with m=0 since they create magnetic fields which are approximately transversely uniform within the imaged volume. They also have the longest lifetime, which can be as long as several seconds. If |m|>0, then the field will vanish at the center, r=0. If |m|=1, then one gets an approximately linear gradient in the magnetic field near the center, which is also very undesirable. In general, it is most desirable to suppress as many low values of m as possible.

Figure 8:
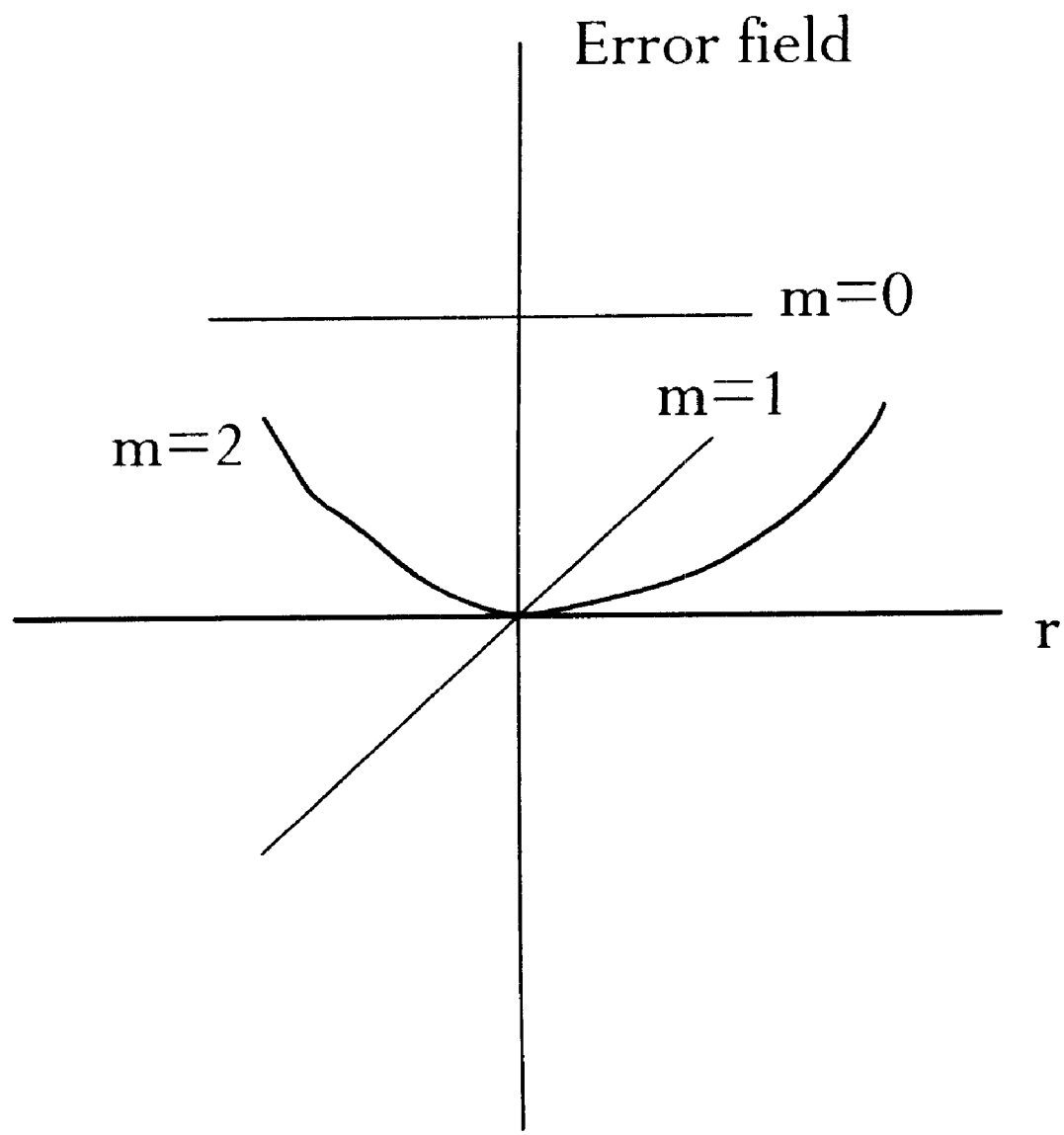
FIG. 8 illustrates error fields for various azimuthal harmonic numbers, m.

FIG. 8 illustrates the error field induced by eddy currents versus the radius from the z-axis, or center of the coil for different values of the azimuthal harmonic number, m. As shown in FIG. 8, the m=0 component is approximately constant within the coil. This approximately constant error creates the largest contribution of all the azimuthal harmonics induced in the MRI system. The m=1 component approximates a linear function versus the radius from the z-axis. Therefore, there is no m=1 error field in the center of the coil, but the m=1 error field increases approximately linearly with increasing radius. This error field is zero at the center of the coil (where most of the imaging occurs). The m=2 component approximates a quadratic function versus the radius from the z-axis. Again, there is no m=2 field at the center of the coil, but the m=2 error field increases with increasing radius. However, the increase is slower than that of the m=1 error field. These curves illustrate that the m=0 component is the most critical component to eliminate in the MRI system. Also, these curves illustrate that the lower the m azimuthal harmonic number, the more important it becomes to reduce that component of the error field.

Figure 2:
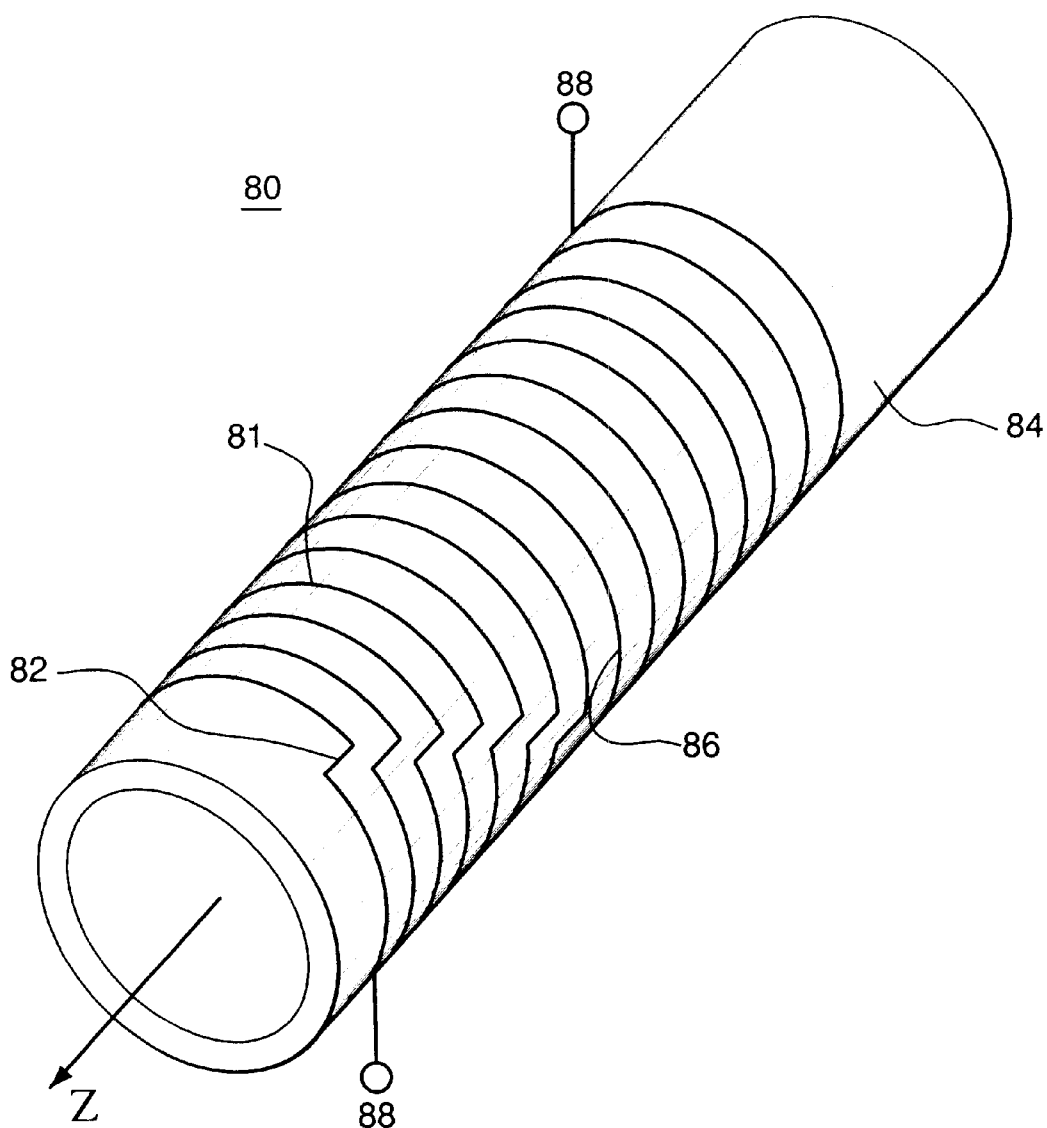
FIG. 2 illustrates an exemplary prior art parallel loop gradient coil.
Figure 3:
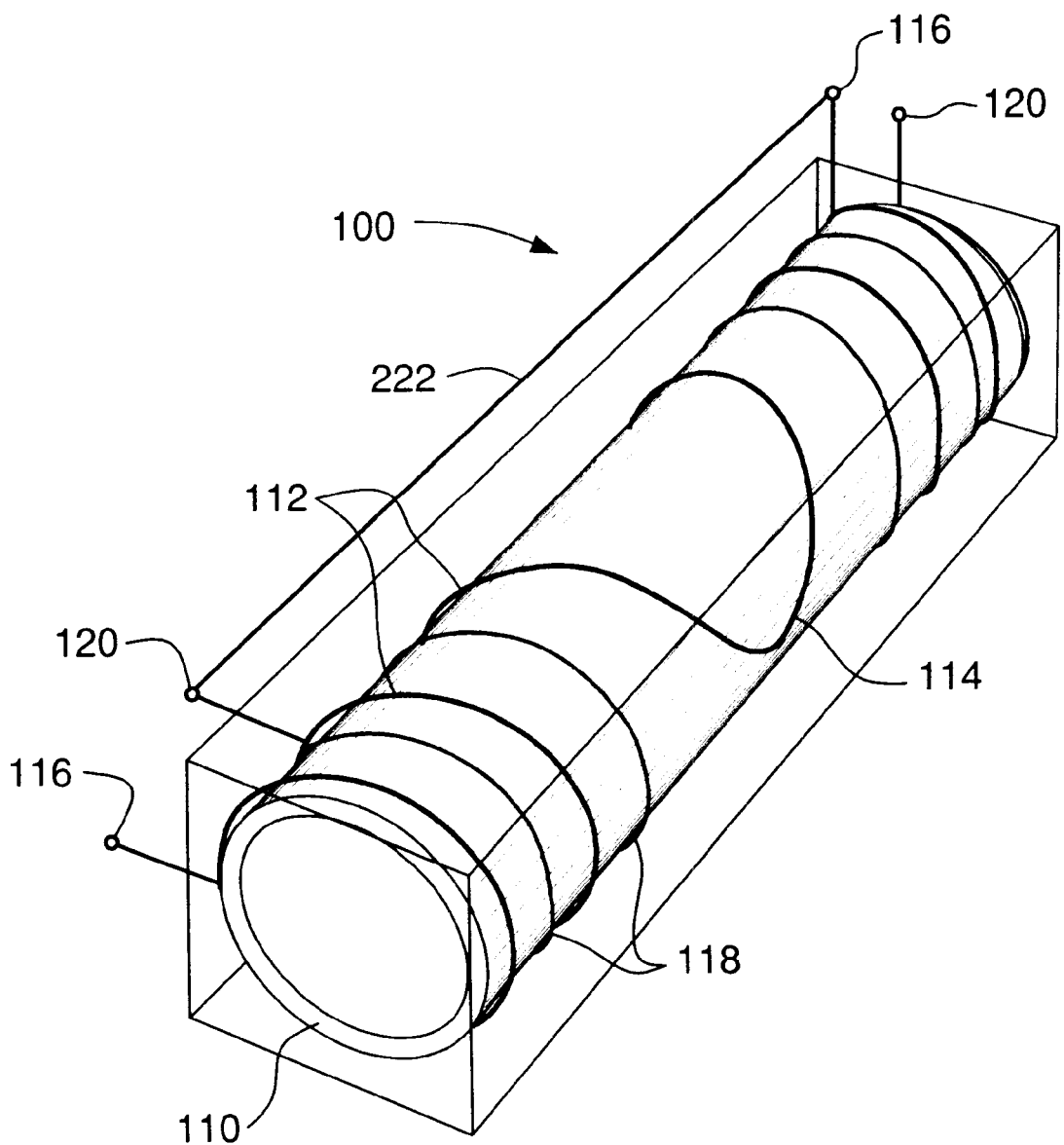
FIG. 3 illustrates an exemplary prior art multiple winding gradient coil.
Figure 9:
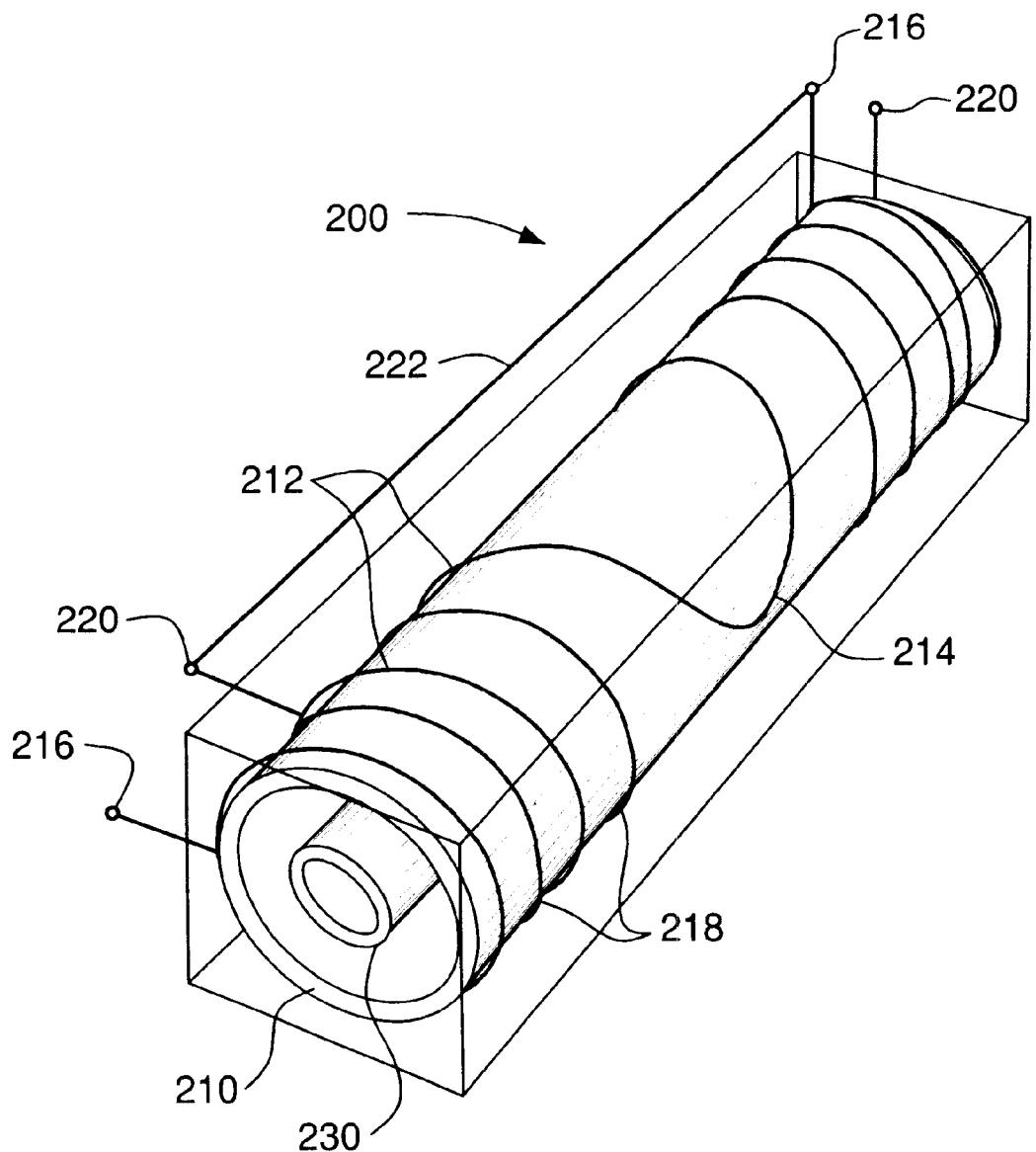
FIG. 9 illustrates a preferred embodiment of a multiple winding shielding coil, in accordance with the present invention.

FIG. 9 illustrates one embodiment of a multiple winding shielding coil in accordance with the present invention. As shown in FIG. 9, the multiple winding shielding coil 200 includes at least two windings. A first electrically conductive winding 212 is wound about the surface of cylindrical coil support structure 210. The first electrically conductive winding 212 is wound helically in a symmetric manner about the center 214 of the coil support structure 210. Terminal connections 216 are connected to the first winding 212. A second electrically conductive winding 218 is also wound in an interleaved manner with respect to the first winding 212. In accordance with the invention, the second winding 218 is offset in azimuthal angle by 180° (360°/2 windings) with respect to the first winding 212. For ease of illustration, the wire diameter of the second winding 218 has been illustrated to have a smaller diameter than the wire diameter of first winding 212. In this embodiment, the multiple winding shielding coil has two windings or N=2, where N=the number of windings. As with the first winding 212, second winding 218 also has a terminal connection 220 to which current may be applied. The multiple winding shielding coil is displaced substantially coaxial and outside of a gradient coil 230, for example, the parallel loop gradient coil 80 as shown in FIG. 2 or the multiple loop gradient coil 100 as shown in FIG. 3.

In another embodiment, four interleaved windings are offset in azimuthal angle by 90° (360°/4 windings) from each other. The multiple winding shielding coil thus corresponds to that of FIG. 9 except that a third winding (not shown) and a fourth winding (not shown) are also wound in an interleaved manner with the first and second windings such that the four windings are offset by 90° with respect to each other. This multiple winding shielding coil has N=4.

Increasing the number of windings increases the performance of the multiple winding shielding coil. However, this requires more wires be placed on the coil support structure 210. One way to fit more wires is to decrease the wire gauge, however, this increases the resistance of the wires, causing increased heat to be generated. Placing the windings in layers, allows more space for windings, while still allowing wires that won't cause excessive heat generation.

Figure 10:
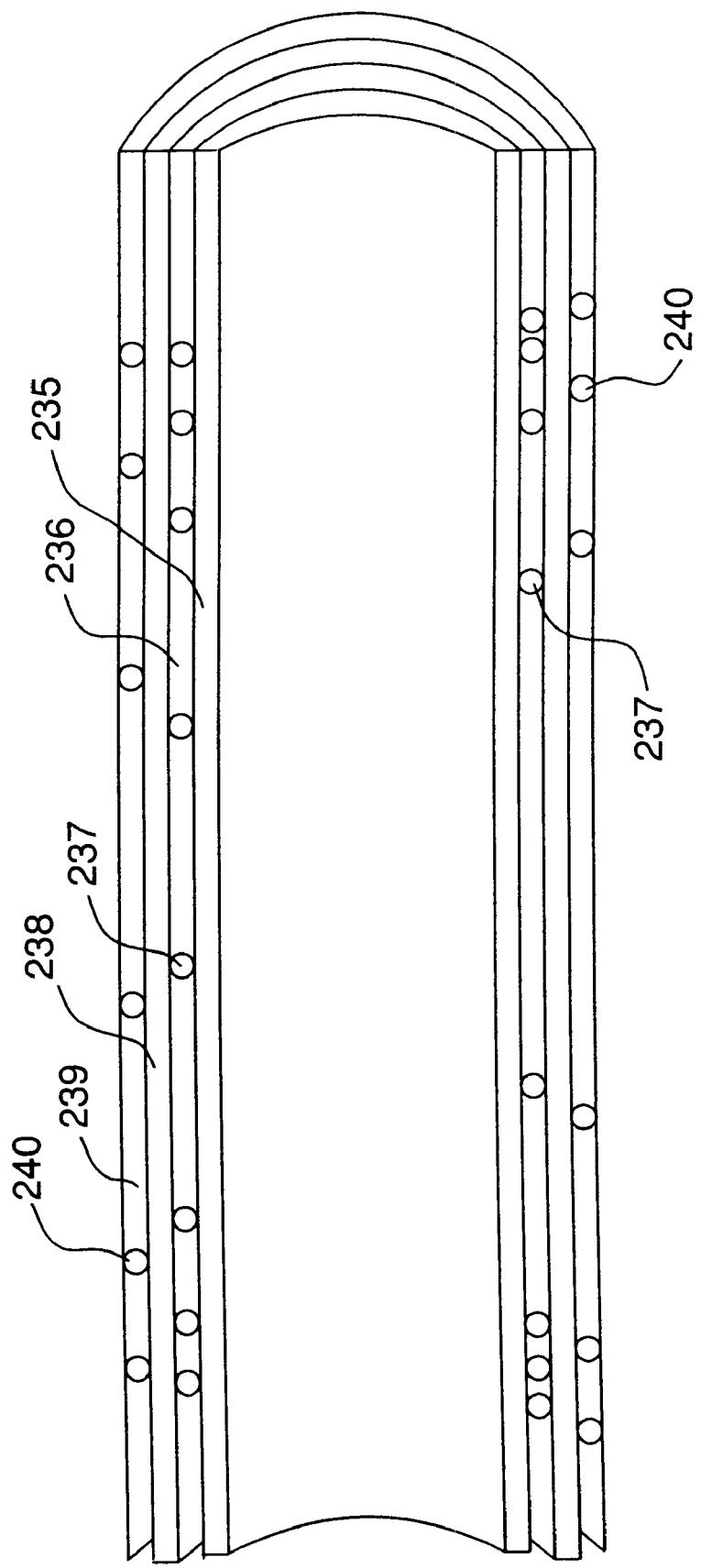
FIG. 10 is a cross sectional view of one embodiment of a multiple winding shielding coil, in accordance with the present invention.

FIG. 10 shows an alternative embodiment of the present invention, where the multiple winding shielding coil includes more than one layer. As shown in FIG. 10, a first layer of windings 236 is wrapped around a first coil support structure 235. An individual winding in the first layer of windings is shown as element 237. The first layer of windings 236 may include a plurality of windings. A second layer of windings 239 is wrapped around a second coil support structure 238. An individual winding in the first layer of windings is shown as element 240. The second layer of windings 240 may include a plurality of windings. The first coil support structure 235 is coaxial with and located within the second coil support structure 238. Alternatively, there may be a plurality of coil support structures.

In one embodiment, the same winding equation for each spiral winding is used and the spiral windings are placed on the different diameter support structures. This will create some error because the ideal winding equation is dependent on the diameter of the support structure. However, such a scheme would still provide approximate shielding.

In another embodiment, separate winding equations for each spiral are calculated, assuming that each spiral is located on its own cylinder with its own diameter. This would mean that each spiral would exactly cancel the m=0 azimuthal component, but it would also mean that the each layer would have its own winding equation and so the various windings would not maintain the exact angular distribution needed to cancel the higher m angular harmonics. This embodiment would also provide only approximate shielding.

In a preferred embodiment, N spiral winding would be wound on each of P coil support structures. In this manner, each cylinder would have exactly the optimum distribution of wires for shielding. As before, all of the spiral windings would be connected in parallel and so the total resistance of the coil set would be reduced to reduce power dissipation and heat. In this case, the formulas used to derive the winding equation would be changed so that each wire was carrying 1/(P*N) amps instead of 1/(N) amps.

Preferably, the windings are placed onto the coil support structure 210 very precisely. To achieve this precision, it is preferred to machine the coil support structure with a computer numerically controlled (CNC) lathe or other equivalent device to produce grooves in the coil support structure. The grooves are placed according to the winding equation and number of windings required to achieve a desired performance level. For example, a desired performance level may be the cancellation of the m=0 component only. A method is described below, with formulas, for determining the number of windings required and the winding equation for each winding. Preferably, the windings are aligned with the grooves and are displaced within the grooves.

Figure 11:
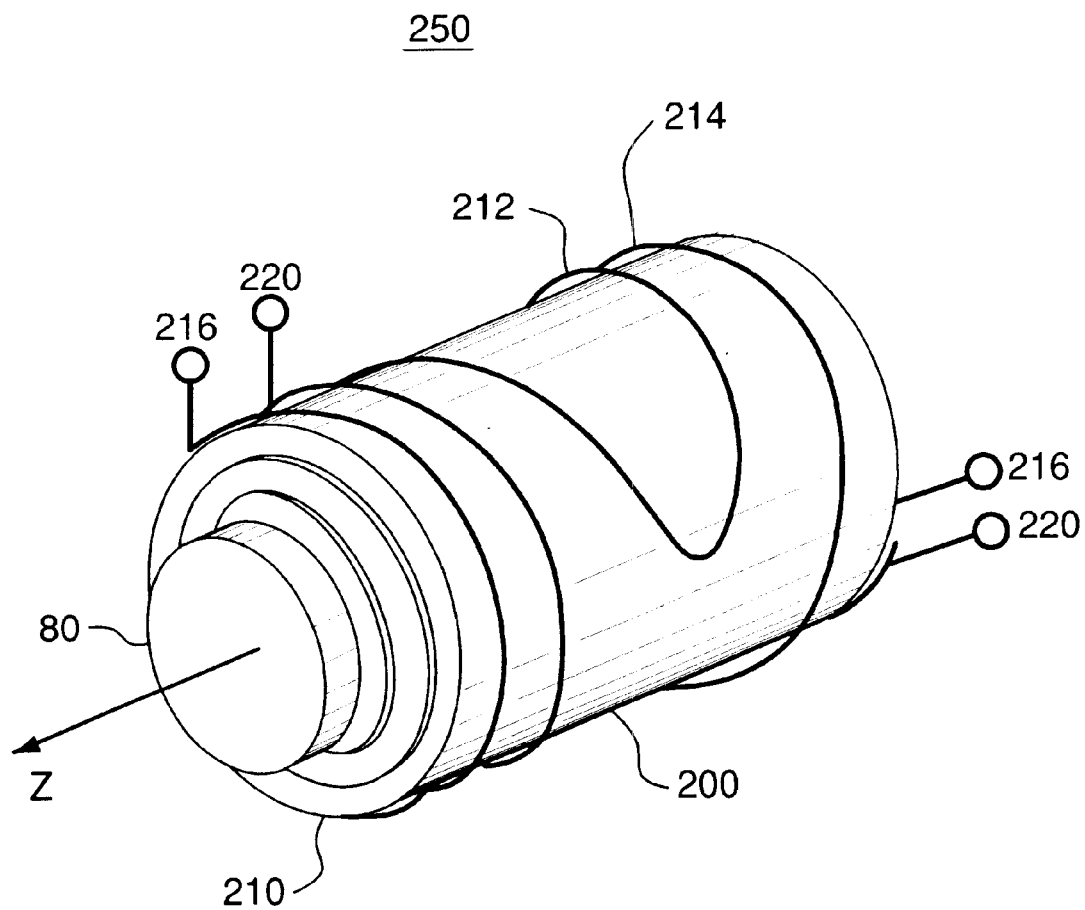
FIG. 11 illustrates an embodiment of a multiple winding shielding coil in a z-coil gradient set, in accordance with the present invention.

FIG. 11 illustrates a preferred embodiment of a gradient coil set in accordance with the present invention. As shown in FIG. 11, gradient coil set 250 comprises a parallel loop gradient coil 80 and a multiple winding shielding coil 200. The parallel loop gradient coil 80 is located coaxially and within the multiple winding shielding coil 200.

Figure 12:
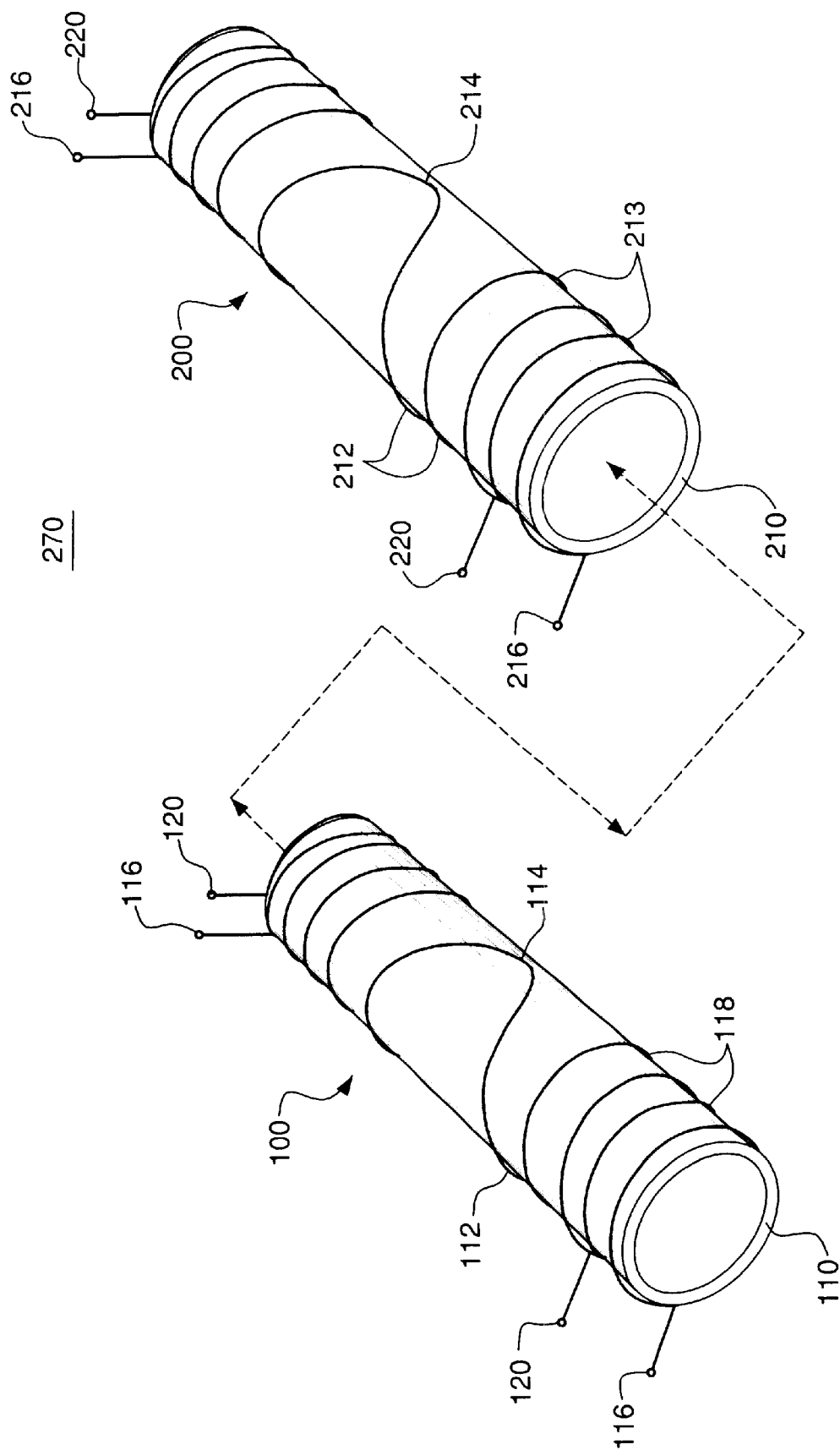
FIG. 12 illustrates a preferred embodiment of a multiple winding shielding coil in a z-coil gradient set, in accordance with the present invention.

Although the described embodiments include only a parallel winding gradient coil and a multiple winding gradient coil, the present invention may be used to shield any type of gradient coil. The following describes a general method of calculating the number of windings, N, and the winding equation required for canceling a particular number of azimuthal harmonics. First, a desired surface current density $\lambda(\phi, z)$ is calculated using known means. The maximum harmonic, M, desired to be cancelled is selected. Using the desired surface current density $\lambda(\phi, z)$ and m, the number of windings required, N, and the winding equation are calculated. Examples are given below for both a parallel loop gradient coil, as shown in FIG. 11 and a multiple winding gradient coil (i.e., a gradient coil not consisting of parallel loops), as shown in FIG. 12.

Parallel Loop Gradient Coil

In the embodiment of FIG. 11, the gradient coil includes only circular loops parallel to the z-axis. It is assumed that the desired current distribution, $\lambda(\phi,z)$, has been determined using known means. If the underlying gradient coil consists solely of circular loops parallel to the z-axis, then $\lambda(\phi,z)$ has no $\phi$ dependence and has only the m=0 component, referred to as $\lambda_o(z)$. The k-th winding in the shielding coil is represented by the winding equation:

$$\theta=2\pi I_k(z) \qquad \text{Equation 4}$$

where $\theta$ is the total number of radians of angle in the winding starting from z=0 meters.

That is, $\theta$ increases by $2\pi$ radians each time the wire encircles the cylinder, and $I_k(z)-I_k(0)$ can be thought of as the number of complete encirclements that the winding undergoes from the center up to position z. Thus, at any point on the winding, the azimuthal angle coordinate $\phi$ is given by $$\phi=\theta \bmod(2\pi) \qquad \text{Equation 5.A}$$

and $$\exp(i\phi)=\exp(i\theta) \qquad \text{Equation 5.B}$$

The functions $I_k$ are computed from:

$$I_k(z) = \int_0^z dz' \lambda_0(z') + (k-1)/N \qquad \text{Equation 6}$$

for k=1 to k=N, and N is the number of windings in the multiple winding shielding coil.

This algorithm gives N windings of similar form uniformly distributed over the azimuthal angle on the cylinder. This method will exactly cancel, in theory, the m=0 component of the field from the parallel loop gradient coil, and will not introduce any other field components with $|m|<N$. In other words, N=M+1, and k runs from k=1 to K=N. For example, using N=2 windings will produce zero for the m=−1, 0, and 1 components of the fields and eddy currents, so that both the field and the gradient due to eddy currents will vanish at all points on the central axis of the cylinder.

Multiple Winding Gradient Coil/Other Than Parallel Loops

FIG. 12 illustrates a preferred embodiment of a gradient coil set in accordance with the present invention. As shown in FIG. 12, gradient coil set 270 comprises a multiple winding gradient coil 100 and a multiple winding shielding coil 200. The multiple winding gradient coil 100 is located coaxially and within the multiple winding shielding coil 200.

If the underlying gradient coil is not composed of circular loops, or for some reason has Fourier components with $|m|>0$, then the preceding algorithm will not work. A gradient coil of this type is shown in FIG. 3. While FIG. 3 illustrates a multiple winding gradient coil, the present invention applies to any gradient coil not consisting of parallel loops. In this case, using N=2M+1 windings will match all the Fourier components of $\lambda(\phi,z)$ up to $|m|=M$. M is the maximum azimuthal harmonic number, m, desired to be cancelled and N is the number of windings in the multiple winding shielding coil. For example, using N=3 winding will cancel both the m=0 and $|m|=I$ (M=1) components. There may exist gradient coils that require less than 2M+1 windings to cancel m harmonics, however, using 2M+1 windings will ensure cancellation of up to and including the $M^{th}$ harmonic.

As in Equation 2, the Fourier coefficient functions for the N=2M+1 Fourier components are calculated to be matched by the spiral windings. It will be necessary to calculate the N functions $I_k(z)$, indexed as k=1 to k=N. To do this, the following N simultaneous equations are set up according to:

$$\int_0^z dz' \lambda_0(z') = (1/N) \sum_{k=1}^{N} (I_k(z) - I_k(0)) \qquad \text{Equation 7.A}$$

for m=0, and $$\int_0^z dz' \lambda_m(z') = (-1/2\pi i m N) \sum_{k=1}^{N} [\exp(-2\pi i m I_k(z)) - \exp(-2\pi i m I_k(0))] \qquad \text{Equation 7.B}$$

for non-zero m from −M to M

Equation (7.B) applies only to the cases $|m|>0$. Equations (7.A) and (7.B) constitute a set of N coupled non-linear equations that can be solved numerically using well-established iterative algorithms. The left-hand sides are known, computable, functions of z. The right-hand sides contain the N unknown functions $I_k(z)$. To compute the solutions, it is necessary to specify the values $I_k(0)$ as well as approximate values of $I_k(z)$ to start the iteration. The former should be specified as:

$$I_k(0)=(k-1)/N \text{ for } k=1 \text{ to } N \qquad \text{Equation 8}$$

and the starting value of all the $I_k(z)$ can be taken from Equation 6, e.g., one can assume that the components with $|m|>0$ are small compared with the m=0 component for any reasonable z-gradient coil.

With the algorithm described, solutions for the N functions are easily obtained with digital computers. For example, a simulated example with N=3 was solved using the commercial software Mathematica (Wolfram Research, Champaign, Ill.) in 13 milliseconds per z point. Thus the computations involved are neither excessively complex nor slow when used in practical cases.

The shielding coil current density will be less than that used in the gradient coil. This is because the function of the shielding coil is to cancel the external field from the gradient coil, and this external field becomes weaker as the gap between the two coils is increased. The current density needed on the shielding coil is computable as described above. It is customary to force the same current to flow through the shielding coil as through the main coil. This has the advantage that the two currents are always directly linked and proportional, which is effective for shielding. However, the reduced current density in the shielding coil means that the winding density will be reduced, and this will tend to reduce the efficiency of shielding. One way to alleviate this problem without increasing N, the number of loops in the shielding coil, is to allow only a fraction of the main coil current to flow in the shielding coil. This could be done, for example, by employing two independent windings in the gradient coil, as illustrated in FIG. 12. Then the shielding coil is fed with the current from one of the gradient coil windings, thus reducing the current to the shielding coil by a factor of 2. The factor by which the current in the shielding coil is reduced would be exactly equal to the number, N', of such independent windings in the gradient coil. In this case, as explained in Equations 6, 7A, and 7B, the right hand side of the equations would have an additional factor of N', with the result that the winding density of the shielding coil spirals would be increased, thus giving more effective shielding.

A technical problem with this approach may be maintaining an exact and precise division of current by factor N' between the gradient coil and shielding coils. This could be accomplished by inserting a compensating inductive and resistive component in series with that part of the gradient current that does not flow into the shielding coil. The purpose of that external component would be to provide to those windings in the gradient coil an inductive and resistive component that matches that of the shielding coil, so that proportional currents would at all times flow in the gradient and shielding coils. An embodiment is illustrated in FIG. 13.

Figure 13:
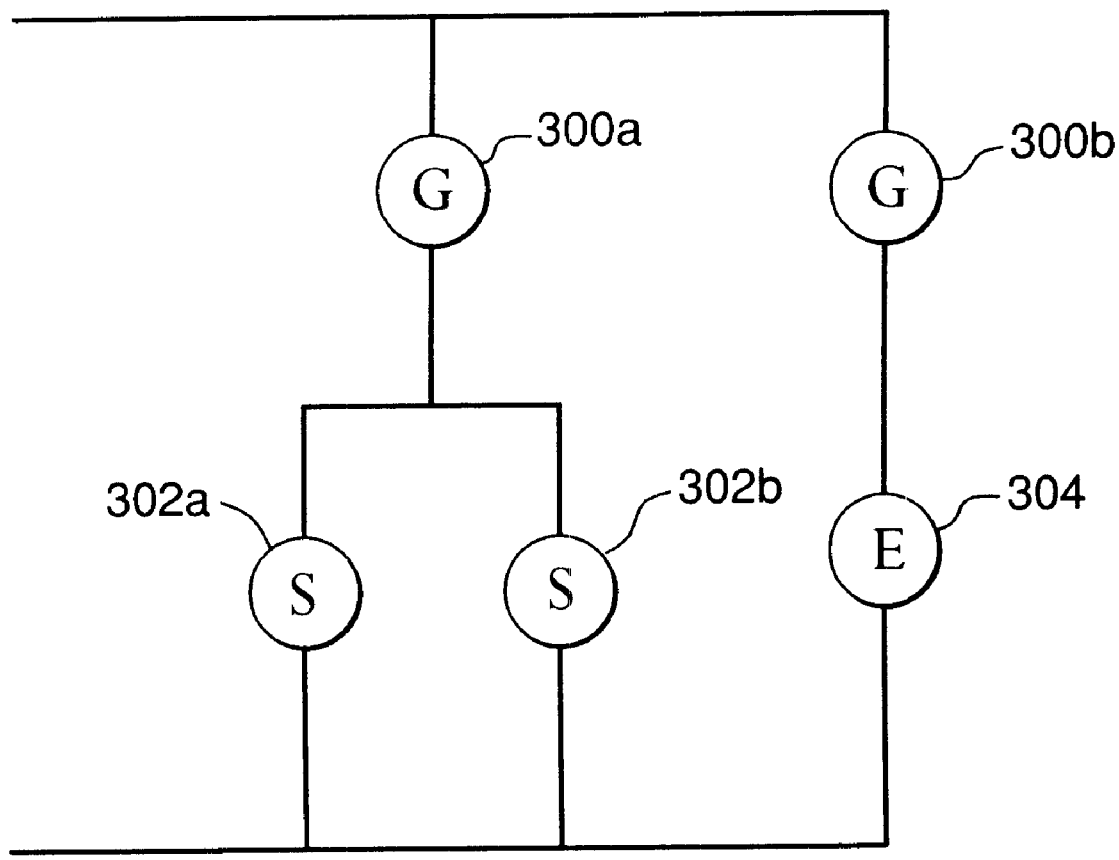
FIG. 13 is a schematic diagram of an embodiment of the present invention.

FIG. 13 shows one embodiment of the present invention, with external coils used to control the current between the gradient coil and the shielding coil. In the embodiment of FIG. 13, the gradient coil set includes one gradient coil and one shielding coil, for example, the gradient coil set of FIG. 12. The gradient coil includes two gradient windings (elements 300a and 300b) and the shielding coil includes two shield windings (elements 302a and 302b). As shown in FIG. 13, the shield windings 302a, 302b are connected in parallel. This parallel connection is then connected in series to the a gradient winding 300a. This passive connection provides that the current through the shielding coil will be a fraction of the current of the gradient coil. This is important, because the current is the shielding coil 200 must be a particular fraction of the current in the gradient coil to properly cancel the magnetic field of the gradient coil. This fraction depends on the difference in radius between the gradient coil and the shielding coil.

The remaining windings of the gradient coil, which are not connected to the shielding coil, may be connected to an external coil to balance the current between the windings of the gradient coil. As shown in FIG. 13, a gradient winding 300b, which is not connected to the shielding coil, is connected in series to an external coil 304. The series combination of the gradient winding 300b and the external coil are connected in parallel to the series combination of the gradient winding 300a and the shield windings (302a, 302b). The external coil 304 should have inductance and resistance substantially equivalent to those of the shielding coil. This provides an economical and highly reliable way to apply only a fraction of the current in the gradient coil 100 to the shielding coil 200. If the same current were applied to both the gradient coil 100 and shielding coil 200, the winding density of the shielding coil 200 would have to be decreased. This would, in turn, increase the eddy current inhomogeneity of higher m harmonic numbers. Hence, applying the multiple lead principle to both the gradient coil 100 and the shielding coil 200 can contribute to better shielding performance than would be possible if the gradient coil contained only a single current path. Alternately, a plurality of external coils may each be connected to in series with each of the remaining gradient windings.

Figure 14:
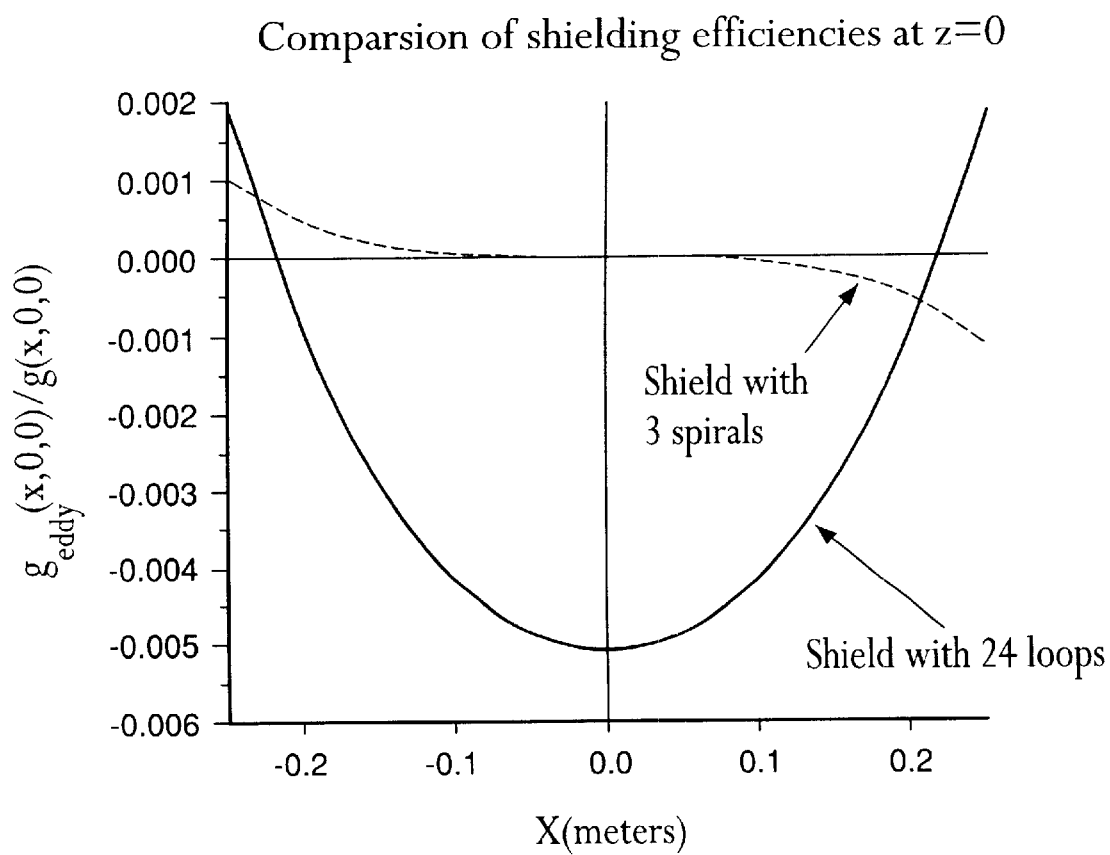
FIG. 14 is a graph showing calculated shielding efficiencies at z=0 meters of a multiple loop shielding coil and a multiple winding shielding coil in accordance with the present invention.

FIG. 14 shows calculated shielding efficiencies at z=0 meters of a multiple loop shielding coil and a multiple winding shielding coil in accordance with the present invention. As shown in FIG. 14, the shielding efficiency of the multiple winding shielding coil with three spirals shields significantly better than a multiple loop shielding coil with twenty-four loops.

Figure 15:
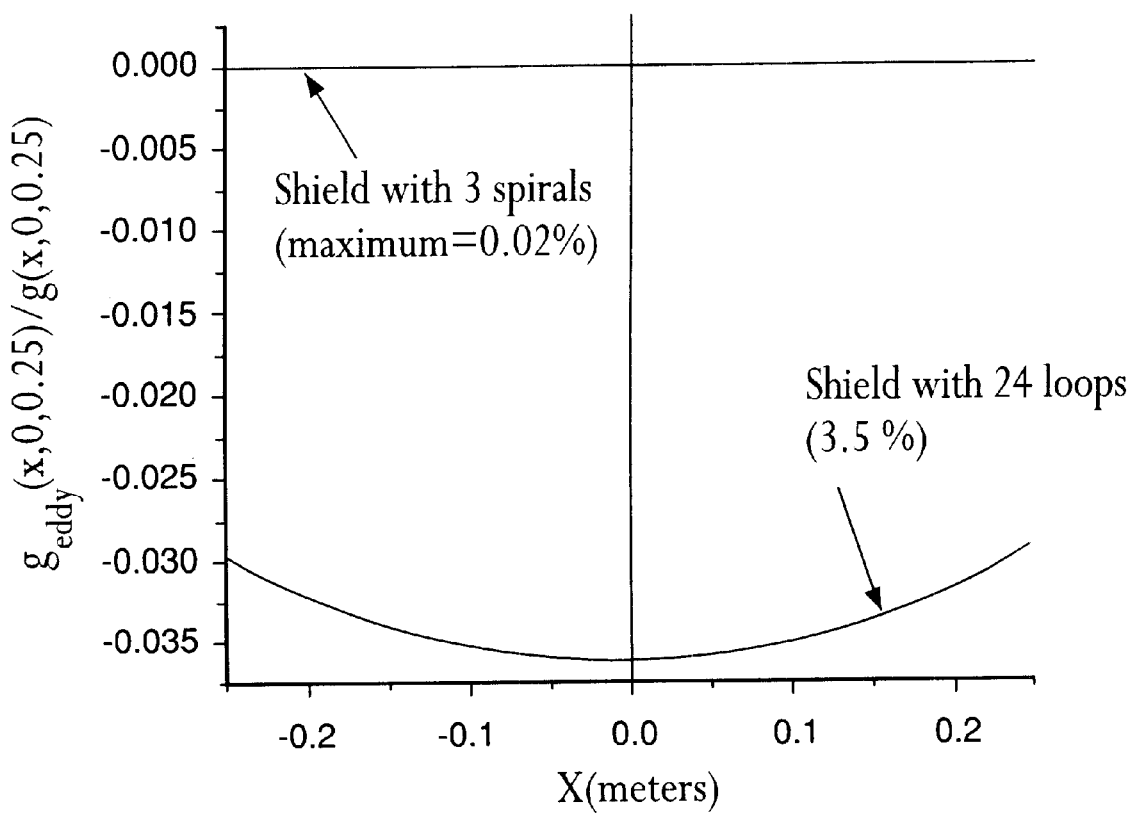
FIG. 15 is a graph showing calculated shielding efficiencies at z=0.25 meters of a multiple loop shielding coil and a multiple winding shielding coil in accordance with the present invention.

FIG. 15 shows calculated shielding efficiencies at z=0.25 meters of a multiple loop shielding coil and a multiple winding shielding coil in accordance with the present invention. As shown in FIG. 15, the shielding efficiency of the multiple winding shielding coil with three spirals shields significantly better than a multiple loop shielding coil with twenty-four loops. In both FIGS. 14 and 15, results are plotted versus the x-coordinate out to a radius of 0.25 meters.

To perform the calculations, the gradient coil was given a diameter of 1.0 meter. The shielding coil diameter was 1.1 meter, and the bore tube of the magnet was taken to be 1.2 meters. The length of the gradient coil was 2.0 meters. These numbers are similar to what are used in clinical whole body MRI scanners.

The gradient coil had the multiple loop design, with a total of 60 loops arranged with 30 loops on each side of the z=0 plane. The spacing of the loops decreased in proportion to the distance from the xy-plane so as to create an approximately linear magnetic field gradient. No effort was made to further decrease the loop spacing at the ends so as to improve the homogeneity of the gradient in the middle region.

No gradient coil is expected to be useful throughout its entire volume; one always uses a central region where the gradient is constant enough for good imaging. In this case, it was assumed that the useful region would extend to $|z|<0.25$ meters in the z-direction and out to a radius of 0.25 meters. The latter represents the maximum transverse diameter of most adult humans (50 cm).

In all cases the distribution of current in the shielding coil was calculated using well known Fourier Transform methods. Once that is done, the number and position of the loops in the multiple loop design is fixed and can not be changed. However, in the multiple winding shielding coil technique one has the freedom to choose the number of winding used in the spirals.

Once the shielding coil parameters were determined, it is possible to calculate the eddy currents that flow in the bore tube. The magnetic field generated by these eddy currents is then calculated for the region inside the gradient coil, (i.e., the region in which the patient's body is present for imaging). The goal of the shielding coil is to reduce these eddy current fields to a minimum in the central portion of the coil.

The multiple winding shielding coil provides, theoretically, zero eddy current field at all points along the z-axis. It will show progressively worse performance as one moves out in radius away from the z axis. However, by increasing the number of windings one achieves better and better suppression of the eddy current fields near the z-axis. It was found that choosing three spirals gave excellent shielding efficiency out to a radius of 0.25 meters. It was found that this coil showed its worst performance in the central plane, z=0 meters, and got progressively better moving out along the z axis. At z=0.25 meters, the largest eddy current field was about 0.02% of the main gradient field.

The z dependence of the multiple loop coil was the opposite of the multiple winding shielding coil. The multiple loop shield coil gave its best performance in the central plane at z=0 meters, and was progressively worse as one moves out along the z axis to z=0.25 meters. Its worst performance at x=y=0 meters and z=0.25 meters showed 3.5% contribution of the eddy currents as compared to the gradient field.

I claim:

1. A cylindrical shielding coil for providing a canceling magnetic field gradient to cancel and error magnetic field gradient created within an imaging volume by eddy currents generated by a gradient coil in a volume outside of said gradient coil, the shielding coil defining an axis therethrough and comprising:
    a non-magnetic electrically insulating cylindrical coil support having an internal cavity which forms a volume for accepting said gradient coil and said imaging volume; and
    N electrically conductive cylindrical windings wound in a plurality of turns in a substantially helical path about a surface of said coil support, each turn of each winding being electrically spaced from each other turn of each said winding such that spacing between respective turns of each said winding decreases in approximate proportion to the distance of said respective turns from a center of each of said windings in a direction parallel to said axis of said coil, each of said N windings being interleavingly wound in the same direction about said surface of said coil support and separated from each other winding of said N windings in an angular orientation of approximately 360°/N about said coil support, whereby N is determined so as to cancel harmonics of an error magnetic field gradient up to and including the $M^{th}$ harmonic.

2. The shielding coil of claim 1 wherein said gradient coil is a parallel loop gradient coil and N=M+1.

3. The shielding coil of claim 1 wherein said gradient coil does not consist of parallel loops and N is no greater than 2M+1.

4. The shielding coil of claim 1 wherein a winding equation of $\theta=2\pi\, I_k(z)$ of said windings is used to cancel harmonics from −M to M of said error magnetic field.

5. The shielding coil of claim 4 wherein said gradient coil is a parallel loop gradient coil and the winding equation of said windings is given by:

$$I_k(z) = \int_0^z dz' \lambda_0(z') + (k-1)/N$$

for k=1 to k=N.

6. The shielding coil of claim 4 wherein said gradient coil does not consist of parallel loops and the winding equation of said windings is given by simultaneously solving the following equations:

$$\int_0^z dz' \lambda_0(z') = (1/N)\sum_{k=1}^{N} (I_k(z) - I_k(0))$$

for m=0, and $$\int_0^z dz' \lambda_m(z') = (-1/2\pi i m N)\sum_{k=1}^{N} [\exp(-2\pi i m I_k(z)) - \exp(-2\pi i m I_k(0))]$$

for non-zero m from −M to M.

7. The shielding coil of claim 1 wherein said windings are displaced 360°/N with respect to each other.

8. The shielding coil of claim 1 wherein said shielding coil includes at least one electrical connection that provides current to said shielding coil.

9. The shielding coil of claim 1 further comprising:
    a second coil support structure coaxial with said first coil support structure, said first coil support structure located within said second coil support structure, wherein at least one of the said N windings is wound around said first coil support structure and at least one of the said N windings is wound around said second coil support structure.

10. A gradient coil set comprising:
    a cylindrical gradient coil; and
    a cylindrical shielding coil defining an axis therethrough and comprising:
        a non-magnetic electrically insulating cylindrical coil support having an internal cavity which forms a volume for accepting said gradient coil; and
        N electrically conductive cylindrical windings wound in a plurality of turns in a substantially helical path about a surface of said coil support, each turn of each winding being electrically spaced from each other turn of each said winding such that spacing between respective turns of each said winding decreases in approximate proportion to the distance of said respective turns from a center of each of said windings in a direction parallel to said axis of said coil, each of said N windings being interleavingly wound in the same direction about said surface of said coil support and separated from each other winding of said N windings in an angular orientation of approximately 360°/N about said coil support.

11. The gradient coil set of claim 10 whereby N is determined so as to cancel harmonics of an error magnetic field gradient created within an imaging volume of said gradient coil by eddy currents generated by said gradient coil in a volume outside of said gradient coil up to and including the $M^{th}$ harmonic.

12. The gradient coil set of claim 10 wherein said gradient coil is a parallel loop gradient coil and N=M+1.

13. The gradient coil set of claim 10 wherein said gradient coil does not consist of parallel loops and N is no greater than 2M+1.

14. The gradient coil set of claim 10 wherein a winding equation of $\theta=2\pi\ I_k(z)$ of said windings is used to cancel harmonics from −M to M said error magnetic field.

15. The gradient coil set of claim 14 wherein said gradient coil does is a parallel loop gradient coil and $$I_k(z) = \int_0^z dz' \lambda_0(z') + (k-1)/N$$

for k=1 to k=N.

16. The gradient coil set of claim 14 wherein said gradient coil does not consist of parallel loops and the winding equation of said windings is given by simultaneously solving the following equations:

$$\int_0^z dz' \lambda_0(z') = (1/N) \sum_{k=1}^{N} (I_k(z) - I_k(0))$$

for m=0, and $$\int_0^z dz' \lambda_m(z') = (-1/2\pi i m N) \sum_{k=1}^{N} [\exp(-2\pi i m I_k(z)) - \exp(-2\pi i m I_k(0))]$$

for non-zero m from −M to M.

17. The gradient coil set of claim 12 wherein said windings of said shielding coil are displaced 360°/N with respect to each other.

18. A gradient coil set of claim 13 wherein said windings of said shielding coil are displaced 360°/N with respect to each other.

19. The gradient coil set of claim 10 further comprising:
  a second coil support structure coaxial with said first coil support structure, said first coil support structure located within said second coil support structure, wherein at least one of the said N windings is wound around said first coil support structure and at least one of the said N windings is wound around said second coil support structure.

20. A magnetic resonance imaging system comprising:
  a main magnetic component;
  a detection component;
  a cylindrical gradient coil; and
  a cylindrical shielding coil defining an axis therethrough and comprising:
    a non-magnetic electrically insulating cylindrical coil support having an internal cavity which forms a volume for accepting said gradient coil; and
    N electrically conductive cylindrical windings wound in a plurality of turns in a substantially helical path about a surface of said coil support, each turn of each winding being electrically spaced from each other turn of each said winding such that spacing between respective turns of each said winding decreases in approximate proportion to the distance of said respective turns from a center of each of said windings in a direction parallel to said axis of said coil, each of said N windings being interleavingly wound in the same direction about said surface of said coil support and separated from each other winding of said N windings in an angular orientation of approximately 360°/N about said coil support, whereby N is determined so as to cancel harmonics of an error magnetic field gradient created within an imaging volume of said gradient coil by eddy currents generated by said gradient coil in a volume outside of said gradient coil up to and including the $M^{th}$ harmonic.

21. The magnetic resonance imaging system of claim 20 wherein said gradient coil is a parallel loop gradient coil and N=M+1.

22. The magnetic resonance imaging system of claim 21 wherein said windings of said shielding coil are displaced 360°/N with no respect to each other.

23. The magnetic resonance imaging system of claim 20 wherein said gradient coil does not consist of parallel loops and N is no greater than 2M+1.

24. A magnetic resonance imaging system of claim 23 wherein said windings of said shielding coil are displaced 360°/N with respect to each other.

25. The magnetic resonance imaging system of claim 20 wherein a winding equation of $\theta=2\pi\ I_k(z)$ of said windings is used to cancel harmonics from −M to M said error magnetic field.

26. The magnetic resonance imaging system of claim 25 wherein said gradient coil is a parallel loop gradient coil and $$I_k(z) = \int_0^z dz' \lambda_0(z') + (k-1)/N$$

for k=1 to k=N.

27. The magnetic resonance imaging system of claim 25 wherein said gradient coil does not consist of parallel loops and the winding equation of said windings is given by simultaneously solving the following equations:

$$\int_0^z dz' \lambda_0(z') = (1/N) \sum_{k=1}^{N} (I_k(z) - I_k(0))$$

for m=0 and $$\int_0^z dz' \lambda_m(z') = (-1/2\pi i m N) \sum_{k=1}^{N} [\exp(-2\pi i m I_k(z)) - \exp(-2\pi i m I_k(0))]$$

for non-zero m from −M to M.

28. The magnetic resonance imaging system of claim 20 wherein said shielding coil includes at least one electrical connection that provides current to said shielding coil.

29. The magnetic resonance imaging system of claim 20 further comprising:
  a second coil support structure coaxial with said first coil support structure, said first coil support structure located within said second coil support structure, wherein at least one of the said N windings is wound around said first coil support structure and at least one of the said N windings is wound around said second coil support structure.

30. A method of determining a number of windings, and a winding equation of said windings, in a z-gradient shielding coil required to cancel harmonics of an error magnetic field created within an imaging volume by eddy currents generated by a gradient coil in a volume outside of said gradient coil comprising:

selecting a maximum $M^{th}$ harmonic to be cancelled in said imaging volume;

determining the type of gradient coil;

if said gradient coil is a parallel loop gradient coil, then determining the number of windings, N, according to N=M+1, and determining the winding equation, $\theta 2\pi I_k(z)$, of said windings, according to $$I_k(z) = \int_0^z dz' \lambda_0(z') + (k-1)/N$$

for k=1 to k=N; and if said gradient does not consist of parallel loops, then determining the number of windings, N, where N is no greater than 2M+1, and determining the winding equation, $\theta 2\pi I_k(z)$, of said windings, where the winding equation of said windings is given by simultaneously solving the following equations:

$$\int_0^z dz' \lambda_0(z') = (1/N) \sum_{k=1}^N (I_k(z) - I_k(0))$$

for m=0 and $$\int_0^z dz' \lambda_m(z') = (-1/2\pi i m N) \sum_{k=1}^N [\exp(-2\pi i m I_k(z)) - \exp(-2\pi i m I_k(0))]$$

for non-zero m from −M to M.

31. A gradient coil set comprising:

a gradient coil comprising a plurality of gradient windings, each said gradient winding having an inductance and resistance;

a shielding coil comprising a plurality of shield windings; and at least one external coil having an inductance and resistance substantially equivalent to the inductance and resistance of said shielding coil, wherein said plurality of shield windings are connected in parallel, one of said plurality of gradient windings is connected in series to said plurality of shield windings, the remaining gradient windings are connected in series with an external coil, and the combination of said one of said plurality of gradient windings connected in series to said plurality of shield windings is connected in parallel to the combination of said remaining gradient windings connected in series with said external coil.

32. The gradient coil set of claim 31 further comprising a plurality of external coils each of said plurality of external coils connected in series with each remaining gradient windings.

* * * * *

UNITED STATES PATENT AND TRADEMARK OFFICE
CERTIFICATE OF CORRECTION

PATENT NO.      : 6,456,076 B1
DATED           : September 24, 2002
INVENTOR(S)     : Peter M. Joseph It is certified that error appears in the above-identified patent and that said Letters Patent is hereby corrected as shown below:

<u>Column 10,</u>
Line 38, please delete "/m/=I" and insert therefore -- /m/=1 --;

<u>Column 17,</u>
Lines 9 and 10, please delete "$\theta 2\pi I_k(2),$" and insert therefore -- $\theta=2\pi I_k(2),$ --;
Line 23, please delete "$\theta 2\pi I_k(2),$" and insert therefore -- $\theta=2\pi I_k(2),$ --;

Signed and Sealed this

Third Day of February, 2004

JON W. DUDAS
*Acting Director of the United States Patent and Trademark Office*